(12) United States Patent
Sato et al.

(10) Patent No.: US 9,239,526 B2
(45) Date of Patent: Jan. 19, 2016

(54) EXPOSURE APPARATUS AND TRANSFER CHARACTERISTICS MEASURING METHOD

(71) Applicant: KABUSHIKI KAISHA TOSHIBA, Minato-ku (JP)

(72) Inventors: Hidenori Sato, Kanagawa (JP); Kazuhiro Segawa, Mie (JP); Nobuhiro Komine, Aichi (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 184 days.

(21) Appl. No.: 14/023,857

(22) Filed: Sep. 11, 2013

(65) Prior Publication Data

US 2015/0022791 A1    Jan. 22, 2015

Related U.S. Application Data

(60) Provisional application No. 61/846,895, filed on Jul. 16, 2013.

(51) Int. Cl.
*G01B 11/14*    (2006.01)
*G01C 21/02*    (2006.01)
(Continued)

(52) U.S. Cl.
CPC .............. *G03F 9/7026* (2013.01); *G03F 7/702* (2013.01); *G03F 7/7085* (2013.01); *G03F 7/70191* (2013.01); *G03F 7/70591* (2013.01)

(58) Field of Classification Search
CPC . G03F 7/70191; G03F 7/702; G03F 7/70233; G03F 7/70516; G03F 7/70591; G03F 7/7085; G03F 9/7023; G03F 9/7026; G03F 9/7088

USPC ......... 250/206–206.3, 559.29, 559.3; 355/52, 355/55, 67, 68, 71, 72, 77; 356/399–401, 356/614–616, 624; 430/30
See application file for complete search history.

(56) References Cited

U.S. PATENT DOCUMENTS

2002/0070355 A1\*   6/2002   Ota ............................ 250/492.2
2008/0180647 A1    7/2008   Sugino
(Continued)

FOREIGN PATENT DOCUMENTS

JP    2002-169266    6/2002
JP    2003-224055    8/2003
(Continued)

OTHER PUBLICATIONS

S. Yoshitake, et al., "Desired IP Control methodology for EUV Mask in Current Mask Process", Proc. of SPIE, vol. 6792, 2008, pp. 1-11.

*Primary Examiner* — Colin Kreutzer
(74) *Attorney, Agent, or Firm* — Oblon, McClelland, Maier & Neustadt, L.L.P.

(57) ABSTRACT

According to one embodiment, an exposure apparatus includes a light blocking unit that blocks an exposure light reflected on a reflective mask at a part other than an aperture; a detection unit that measures a light intensity of the exposure light passed through the light blocking unit; and a calculation unit that calculates, based on the light intensity, a transfer characteristic when a pattern on the reflective mask is transferred to a substrate. In the light blocking unit, a position on an aperture plane and a position in an optical axis direction of the exposure light are adjusted. The calculation unit calculates the transfer characteristic based on the position in the optical axis direction in which the light intensity is maximized.

10 Claims, 11 Drawing Sheets

(51) Int. Cl.
*G01N 21/88* (2006.01)
*G03B 27/32* (2006.01)
*G03B 27/52* (2006.01)
*G03B 27/54* (2006.01)
*G03B 27/68* (2006.01)
*G03B 27/72* (2006.01)
*G03F 9/00* (2006.01)
*G03F 7/20* (2006.01)

(56) References Cited

U.S. PATENT DOCUMENTS

2009/0153830 A1* 6/2009 Kok ............................... 355/68

2010/0136488 A1 6/2010 Fukuhara

FOREIGN PATENT DOCUMENTS

| | | |
|---|---|---|
| JP | 2004-79585 | 3/2004 |
| JP | 2005-129557 | 5/2005 |
| JP | 2006-128439 | 5/2006 |
| JP | 2006-165216 | 6/2006 |
| JP | 2006-332561 | 12/2006 |
| JP | 2008-182097 | 8/2008 |
| JP | 2008-186912 | 8/2008 |
| JP | 2010-128279 | 6/2010 |

* cited by examiner

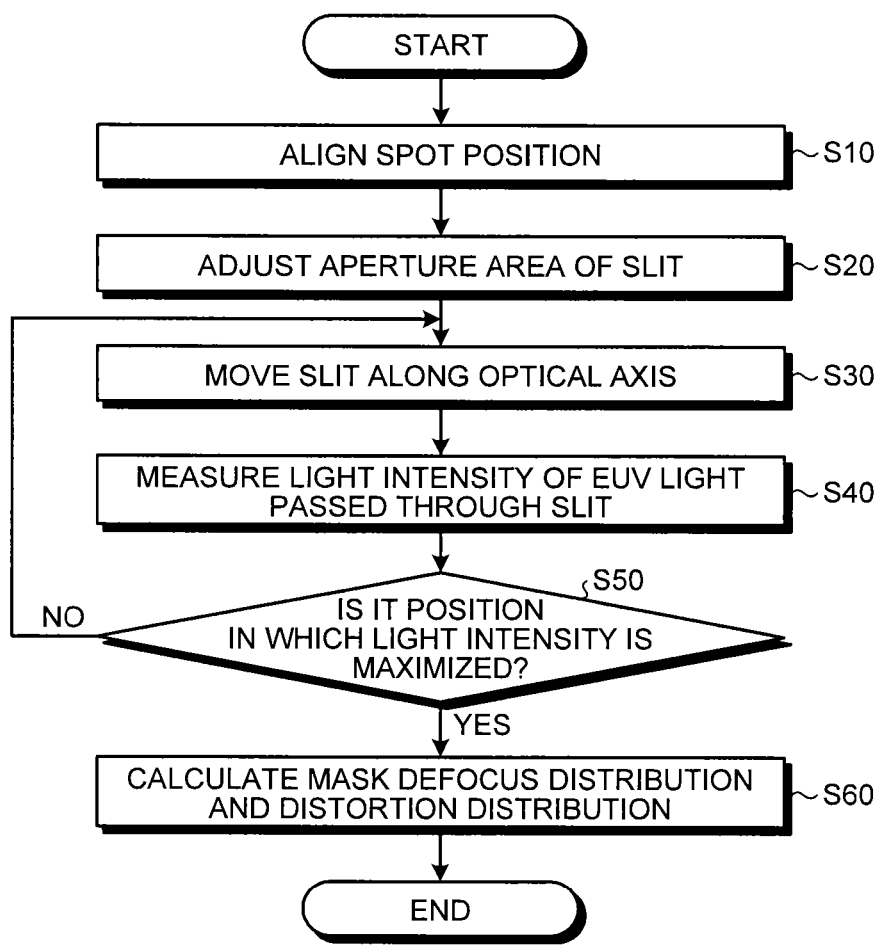

EXPOSURE APPARATUS AND TRANSFER CHARACTERISTICS MEASURING METHOD

CROSS-REFERENCE TO RELATED APPLICATIONS

This application is based upon and claims the benefit of priority from U.S. Provisional Application No. 61/846,895), filed on Jul. 16, 2013; the entire contents of which are incorporated herein by reference.

FIELD

Embodiments described herein relate generally to an exposure apparatus and a transfer characteristics measuring method.

BACKGROUND

In a process for manufacturing a semiconductor apparatus including semiconductor devices such as a transistor, a pattern miniaturization is an indispensable technique in order to increase the integration degree. Various lithography techniques have been developed in these years in order to further miniaturize the pattern. Such lithography techniques include an Extreme Ultra Violet (EUV) exposure technology that uses an EUV light as the exposure light.

The exposure light used in the EUV exposure technology has a very short wavelength of around 13.5 nm. Thus, the EUV exposure technology is recognized as a lithography technique that resolves a very fine pattern of 50 nm or less.

A mask used in an EUV exposure technology apparatus applies an electrostatic chuck system as the absorption system because the mask is used under vacuum. However, a mask defocus possibly occurs due to a particle attached on the absorbing unit or the variation of the absorption force in the electrostatic chuck system. When a mask defocus occurs in the EUV exposure technology apparatus, a defocus occurs in the transfer pattern on the wafer and a distortion also occurs in the transfer pattern. A lithography technique using an ArF light in the past can measure the mask defocus. However, it is difficult in the EUV exposure technology apparatus to measure the amount of flection of the mask (mask defocus) and the amount of deformation (distortion) of the mask. Thus, there is a need to measure the amount of flection and the amount of deformation of the mask even in the EUV exposure technology apparatus.

BRIEF DESCRIPTION OF THE DRAWINGS

FIG. 4 is a flowchart of a process for measuring a mask defocus distribution and a distortion distribution.

DETAILED DESCRIPTION

In general, according to one embodiment, an exposure apparatus includes a light blocking unit that passes an exposure light reflected on a reflective mask through an aperture and that blocks the exposure light at a part other than the aperture. The exposure apparatus further includes a detection unit that measures the light intensity of the exposure light passed through the light blocking unit, and a calculation unit that calculates the transfer characteristics when a pattern on the reflective mask is transferred to a substrate, based on the light intensity. The in-plane position in the light blocking unit that is the position of the aperture on the aperture plane is adjusted and the position in the axial direction that is a position in the optical axis of the exposure light is adjusted. The calculation unit calculates the transfer characteristics based on the position in the axial direction in which the maximum light intensity is maximized.

Exemplary embodiments of the exposure apparatus and a transfer characteristics measuring method will be explained below in detail with reference to the accompanying drawings. The present invention is not limited to the following embodiments.

First Embodiment

Figure 1:
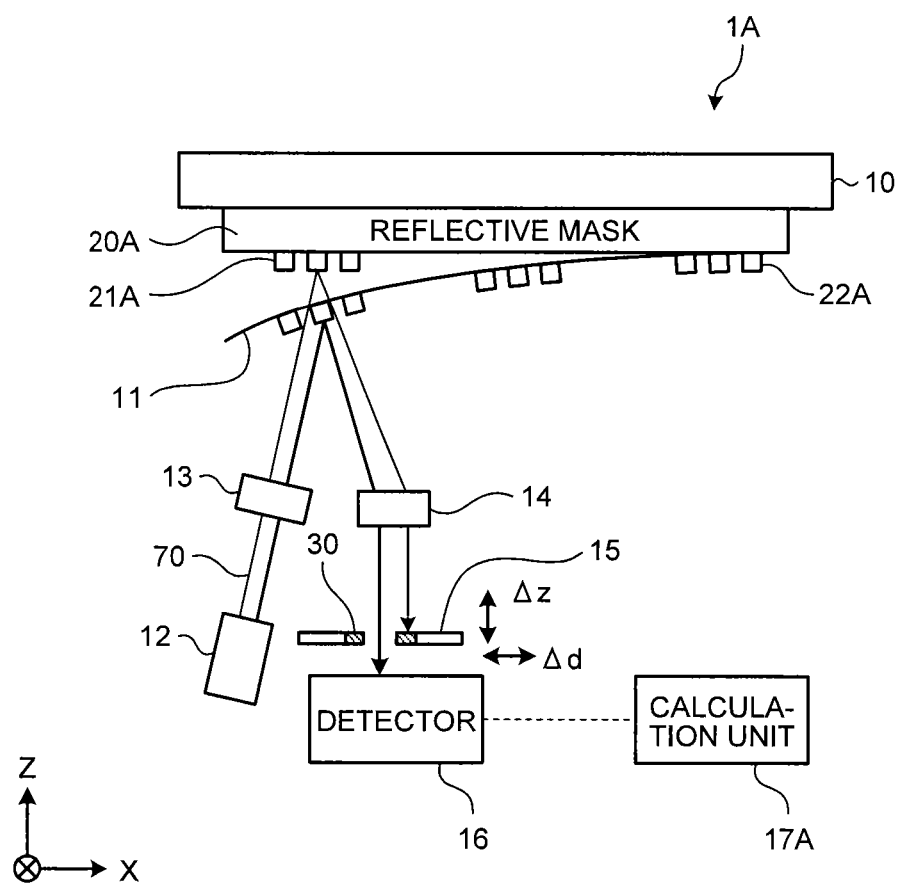
FIG. 1 is a diagram of a configuration of an exposure apparatus according to a first embodiment.

FIG. 1 is a diagram of a configuration of an exposure apparatus according to a first embodiment. FIG. 1 is a schematic side view of an exposure apparatus 1A. The exposure apparatus 1A is used for a lithography process in the process for manufacturing a semiconductor apparatus. The exposure apparatus 1A uses an Extreme Ultra Violet (EUV) light as the exposure light. The exposure apparatus 1A measures the mask defocus (defocus value) of an EUV light exposure mask (reflective mask 20A) and corrects the focus value.

The exposure apparatus 1A in the present embodiment includes a slit (variable light blocking slit 30) (light blocking unit) that is capable of changing the light blocking position along the optical axis of an EUV light 70 reflected on the reflective mask (reticle) 20A and that is capable of changing the aperture shape.

It is difficult to measure the flection in a manner in the past because the flection of the reflective mask 20A displaces not only the focus height ($\Delta z$) but also the imaging position ($\Delta d$) in the exposure apparatus 1A using the EUV exposure technology. In the present embodiment, the exposure apparatus 1A calculates the amount of mask flection and the amount of mask deformation that affect the transfer characteristics of the reflective mask 20A by measuring the focus position (Z direction) after adjusting an aperture area (aperture) of the variable light blocking slit 30 in an X and Y direction (on the plane perpendicular to the optical axis).

The transfer characteristics of the reflective mask 20A are, for example, a mask defocus distribution and a distortion distribution. The mask defocus distribution is the distribution of the defocus values on a mask surface of the reflective mask 20A. The distortion distribution is the distribution of the amount of distortion on the mask surface of the reflective mask 20A.

The exposure apparatus 1A includes a mask stage 10, a light source 12, an illumination optical system 13, a projection optical system 14, a wafer stage 15, a detector (detection unit) 16, a calculation unit 17A, and the variable light blocking slit 30.

The mask stage 10 absorbs the reflective mask (EUV mask) 20A, for example, using the electrostatic chuck system. The mask stage 10 fixes the reflective mask 20A by absorbing the backside surface of the reflective mask 20A. In other words, the mask stage 10 fixes the reflective mask 20A so as to irradiate the front side (the side on which a mask pattern is formed) of the reflective mask 20A with the EUV light 70.

The light source 12 is an exposure light source that causes the irradiation with the EUV light 70. The light source 12 irradiates the illumination optical system 13 side with the EUV light 70. The EUV light 70 has a wavelength of 13.5 nm. The illumination optical system 13 includes a mirror or the like and is positioned between the light source 12 and the mask stage 10. The illumination optical system 13 projects the EUV light 70 onto the reflective mask 20A.

The reflective mask 20A is formed with a substrate including a low thermal expansion material (for example, a glass substrate), a reflective layer (reflective multi-layer film) in which molybdenum (Mo) and silicon (Si) are multiply stacked on the substrate, and a light blocking pattern formed on the reflective layer. A circuit pattern 22A of the semiconductor apparatus and a measurement mark (monitor pattern) 21A are formed as a mask pattern on the reflective mask 20A in the present embodiment.

The measurement mark 21A is used for measuring the amount of mask flection (mask defocus) and the amount of deformation (distortion) of the reflective mask 20A. The mask defocus and the distortion are the transfer characteristics when the pattern on the reflective mask 20A is transferred to a wafer WA. Thus, the measurement mark 21A is used for measuring the transfer characteristics of the reflective mask 20A. The measurement mark 21A is formed at an area different from the area in which the circuit pattern 22A is formed. The measurement mark 21A is, for example, a light blocking pattern with lines and spaces.

When the circuit pattern is transferred onto the semiconductor substrate (the wafer WA to be described below), the circuit pattern is irradiated with the EUV light 70. When the mask defocus (mask defocus distribution) and the distortion (distortion distribution) are measured, the measurement mark 21A is irradiated with the EUV light 70.

The projection optical system 14 includes a lens or the like and is positioned between the mask stage 10 and the wafer stage 15. The projection optical system 14 concentrates the EUV light 70 reflected on the reflective mask 20A (reflected light) onto the wafer stage 15.

When the circuit pattern is transferred on the wafer WA, the projection optical system 14 concentrates the EUV light 70 onto the wafer WA of the wafer stage 15. When the mask defocus or the like is measured, the projection optical system 14 concentrates the EUV light 70 onto the variable light blocking slit 30 on the wafer stage 15.

The wafer stage 15 places and supports the wafer WA thereon. The wafer stage 15 moves in the optical axis direction of the EUV light 70 (Z-axis direction) and moves on the plane (X and Y plane) perpendicular to the optical axis direction of the EUV light 70.

The variable light blocking slit 30 is configured to change the aperture area through which the EUV light 70 passes. The variable light blocking slit 30 is positioned, for example, on the wafer stage 15. When the mask defocus or the like is measured, the aperture shape area in the variable light blocking slit 30 is adjusted so as to correspond to the irradiation area on the wafer stage 15 that is to be irradiated with the EUV light 70. Specifically, in the variable light blocking slit 30, the aperture dimension of the aperture area and the in-plane position that is the position of the aperture area on the aperture plane are adjusted. Further, the position of the variable light blocking slit 30 (aperture area) in the axial direction that is the position in the optical axis direction of the EUV light 70 is adjusted. The variable light blocking slit 30 passes the exposure light reflected on the reflective mask 20A through the aperture area and blocks the exposure light at a part other than the aperture area.

Note that the variable light blocking slit 30 can be positioned at a position different from the wafer stage 15. Even in that case, the variable light blocking slit 30 is configured to move in the optical axis direction of the EUV light 70 (Z-axis direction) near the same height as the wafer WA on the wafer stage 15.

The detector 16 is positioned under the lower side of the wafer stage 15 (the side opposite to the mask stage 10). The detector 16 is a two-dimensional detector that measures the light intensity (light quantity) of the EUV light 70 that has passed through the aperture area of the variable light blocking slit 30. The detector 16 is, for example, a Charge Coupled Device (CCD) camera or a Time Delay Integration (TDI) sensor that has a pixel resolution of 50 nm per side.

The calculation unit 17A is connected to the detector 16. The calculation unit 17A calculates the amount of mask flection and the amount of mask deformation (mask defocus and distortion) of the reflective mask 20A based on the result (light intensity) measured with the detector 16. The detector 16 measures the light intensity at each position of the variable light blocking slit 30 in the optical axis direction. The calculation unit 17A obtains the position of the variable light blocking slit 30 in the optical axis direction in which the light intensity is maximized among the light intensities measured with the detector 16 from a drive unit (not illustrated in the drawings) that drives the wafer stage 15 so as to derive the mask defocus of the reflective mask 20A based on the obtained position.

The illumination optical system 13 irradiates the reflective mask 20A on the mask stage 10 with the EUV light 70 from the light source 12. The EUV light 70 is reflected on the reflective mask 20A and transmitted to the projection optical system 14.

When the mask defocus or the like is measured, the measurement mark 21A is irradiated with the EUV light 70. The EUV light 70 is reflected on the measurement mark 21A. The illumination optical system 13 causes the EUV light 70 from the light source 12 to enter the reflective mask 20A at an angle of 6°.

The EUV light 70 reflected on the measurement mark 21A is transmitted to the projection optical system 14. As a result, the projection optical system 14 causes the EUV light 70 reflected on the reflective mask 20A to form an image on the variable light blocking slit 30 on the wafer stage 15. The detector 16 measures the light intensity of the EUV light 70 that has passed through the variable light blocking slit 30 from among the EUV light 70 with which the variable light blocking slit 30 has been irradiated. The calculation unit 17A calculates the mask defocus and distortion of the reflective mask 20A based on the position having the maximum result (detection value of the light intensity) measured with the detector 16.

The particle or the like attached between the reflective mask 20A and the mask stage 10 possibly warps the reflective mask 20A like a state 11. A mask defocus or a distortion occurs in such a case. In the present embodiment, the mask defocus and distortion of the reflective mask 20A are calculated based on the light intensity of the EUV light 70 that has passed through the variable light blocking slit 30.

Figure 2A:
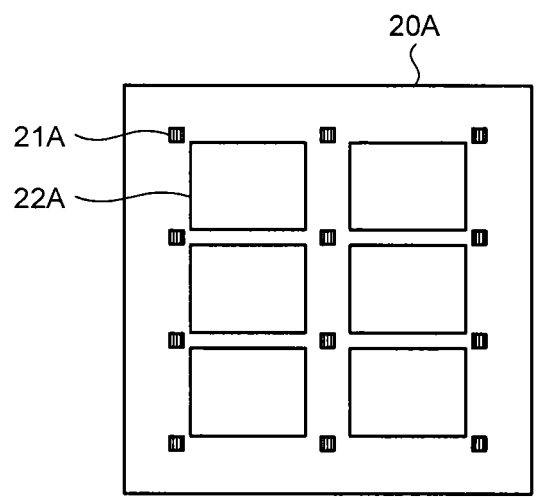
FIG. 2A is a diagram of a configuration of a reflective mask according to the first embodiment.

FIG. 2A is a diagram of a configuration of the reflective mask according to the first embodiment. FIG. 2A is a top view of the reflective mask 20A. The circuit patterns 22A and the measurement marks 21A are positioned at the reflective mask 20A. Each of the circuit patterns 22A corresponds to a chip. Thus, one to a plurality of circuit patterns 22A is positioned at the reflective mask 20A. A plurality of measurement marks 21A is positioned at the reflective mask 20A. The measurement marks 21A are positioned, for example, on a scribe line (dicing line) between the chips (the circuit patterns 22A) or the outer periphery of the shot. FIG. 2A illustrates that the measurement marks 21A are positioned at 12 places on the reflective mask 20A.

Figure 2B:
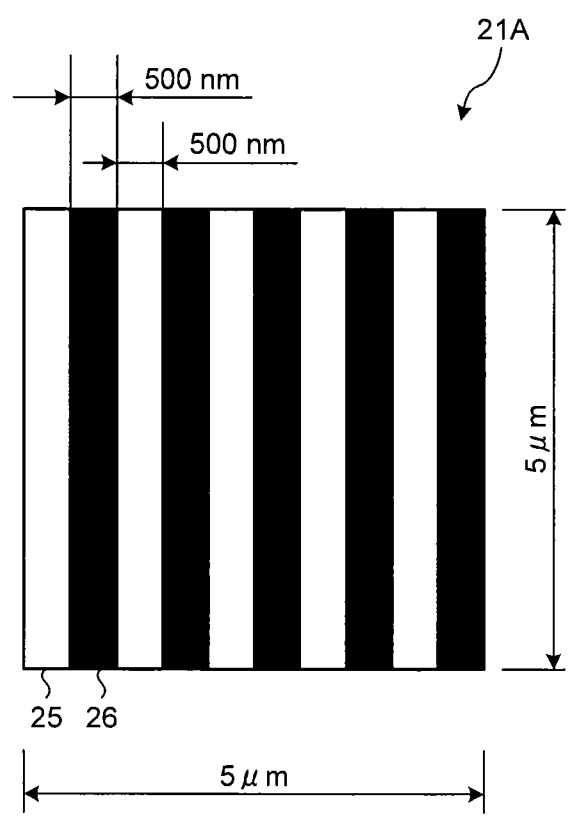
FIG. 2B is a diagram of a configuration of a measurement mark according to the first embodiment.

FIG. 2B is a diagram of a configuration of the measurement mark according to the first embodiment. FIG. 2B is a top view of the measurement mark 21A. The measurement mark 21A is, for example, positioned in an area having a width of 5 μm and a length of 5 μm. The measurement mark 21A includes a light blocking pattern 26 and a space pattern 25. The light blocking pattern 26 is, for example, a rectangular pattern (line pattern) having a width of 500 nm and a length of 5 μm. The space pattern 25 is, for example, a rectangular pattern having a width of 500 nm and a length of 5 μm. In other words, the repeated patterns with a line and a space each having a width of 500 nm and a length of 5 μm form the measurement mark 21A.

Figure 3A:
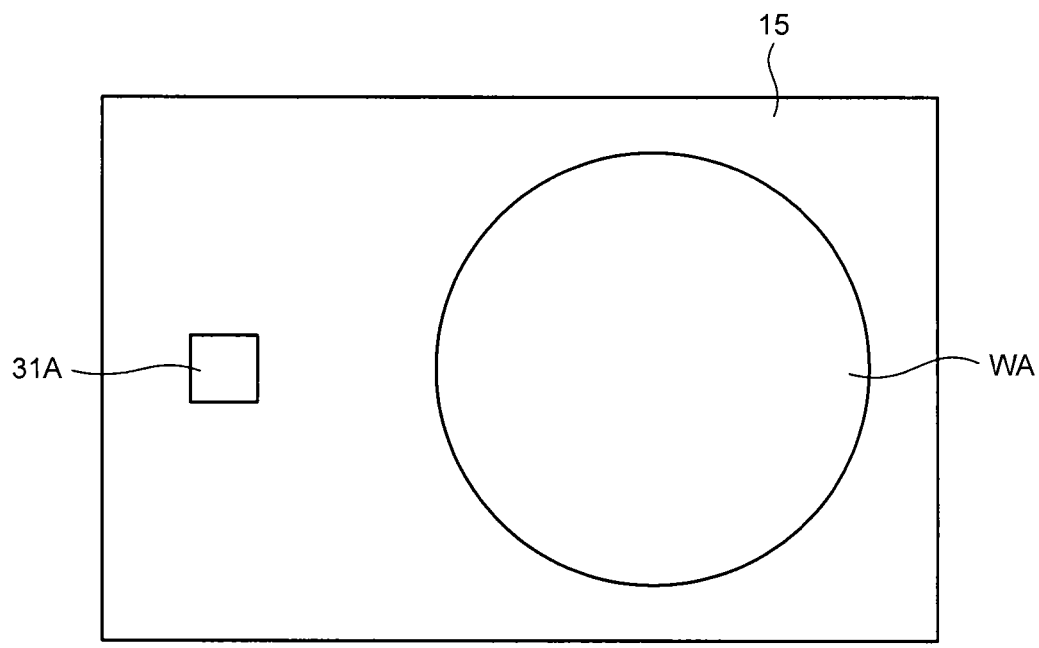
FIG. 3A is a diagram of a configuration of a wafer stage according to the first embodiment.

FIG. 3A is a diagram of a configuration of the wafer stage according to the first embodiment. FIG. 3A is a top view of the wafer stage 15. The wafer stage 15 places the wafer WA thereon. The wafer stage 15 is provided with an alignment area 31A in an area different from the area in which the wafer WA is placed. The alignment area 31A is an area in which the variable light blocking slit 30 is placed.

Figure 3B:
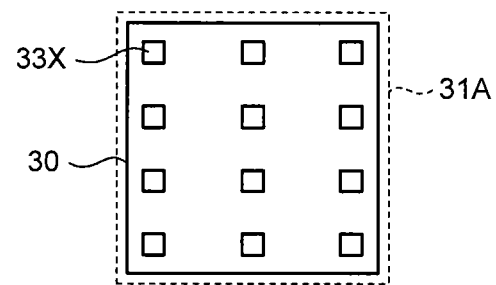
FIG. 3B is a diagram of a configuration of a variable light blocking slit.

FIG. 3B is a diagram of a configuration of the variable light blocking slit. FIG. 3B is a top view of the alignment area 31A. The variable light blocking slit 30 provided in the alignment area 31A is configured to change the size and shape of an aperture area 33X. The variable light blocking slit 30 is provided with a plurality of aperture areas 33X. In that case, the aperture areas 33X are positioned at the places corresponding to the positions of the measurement marks 21A.

The variable light blocking slit 30 passes only the EUV light 70 with which the aperture areas 33X are irradiated and blocks the EUV light 70 with which the area except for the aperture areas 33X is irradiated when the variable light blocking slit 30 is irradiated with the EUV light 70. The variable light blocking slit 30 changes the aperture shape of the aperture area 33X so as to blocks a defocus light in the EUV light 70 and pass the EUV light 70 except for the defocus light.

Figure 3C:
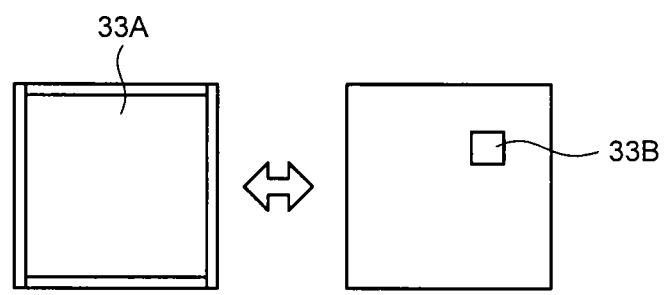
FIG. 3C is a diagram for describing an aperture shape of an aperture area provided in the variable light blocking slit.

FIG. 3C is a diagram for describing an aperture shape of an aperture area provided in the variable light blocking slit. The variable light blocking slit 30 has a thickness, for example, of 0.1 mm. The operation of a slit changes the light blocking area (aperture area 33X).

The aperture area 33X of the variable light blocking slit 30, for example, becomes a square of 2 mm per side when being fully opened and becomes a square of 0.01 mm per side when being fully closed. FIG. 3C illustrates that the aperture area 33X changes into an aperture area 33A or an aperture area 33B. The aperture area 33A is the aperture area when fully being opened. The aperture area 33B is the aperture area when fully being closed.

Note that the shape and the size of the variable light blocking slit 30 are not limited to the above. For example, the shape can be a rectangle, a hexagon, or a circle. The aperture area 33X can also be configured to change the shape and size only in a direction.

Next, a process for measuring a mask defocus distribution and a distortion distribution will be described. FIG. 4 is a flowchart of the process for measuring the mask defocus distribution and the distortion distribution.

When being loaded to the exposure apparatus 1A, the reflective mask 20A is fixed onto the mask stage 10 after the position of the reflective mask 20A is adjusted on the mask stage 10. After that, the variable light blocking slit 30 is fully opened. Note that, instead of fully being opened, the variable light blocking slit 30 can be moved to the position through which whole the EUV light 70 passes (bypass position) without the irradiation of the variable light blocking slit 30 with the EUV light 70.

After that, the measurement marks 21A provided on the reflective mask 20A are irradiated with the EUV light 70. Thus, the EUV light 70 is reflected on the measurement marks 21A. The reflected light from the measurement mark 21A is detected in the detector 16 positioned under the lower side of the wafer stage 15.

The detector 16 transmits the detected light intensity to the calculation unit 17A. The calculation unit 17A creates a light intensity map based on the light intensity. Then, the calculation unit 17A calculates and stores the spot position (Xs and Ys) that is the center of the light intensity map. The spot position calculated with the calculation unit 17A is the position (coordinate) having the maximum light intensity.

Next, the calculation unit 17A finds the amount of misalignment of the spot position (AXs and AYs) based on the difference (coordinate difference) between the design coordinate of the spot position and the calculated spot position. This completes the alignment process at the spot position (step S10).

Next, the exposure apparatus 1A adjusts the aperture area 33X in the variable light blocking slit 30 (step S20). Specifically, the exposure apparatus 1A narrows the aperture area 33X such that the aperture area 33X has a width of a predetermined dimension (for example, 0.01 mm) centering the spot position (Xs and Ys).

Note that, instead of the adjustment of the dimension of the variable light blocking slit 30, the aperture area previously formed in a predetermined dimension (for example, a width of 0.01 mm) can be moved from the bypass position to the spot position (Xs and Ys) (light blocking position). In other words, moving the aperture area having a predetermined area to the spot position can adjust the aperture area such that the aperture area centers the spot position therein.

After that, the exposure apparatus 1A moves the variable light blocking slit 30 (the wafer stage 15) along the optical axis (the Z-axis direction) (step S30). The detector 16 measures the light intensity of the EUV light 70 that has passed through the variable light blocking slit 30 (step S40). The light intensity is transmitted from the detector 16 to the calculation unit 17A. Then, the calculation unit 17A determines whether the position of the variable light blocking slit 30 in the optical axis direction is the position having the maximum light intensity (step S50).

When the position of the variable light blocking slit 30 in the optical axis direction is at a plus defocus position or a minus defocus position, a part of the EUV light 70 is blocked with the variable light blocking slit 30. This decreases the light intensity detected in the detector 16. On the other hand, when the position of the variable light blocking slit 30 in the optical axis direction is at a best focus position, nearly the whole EUV light 70 passes through the variable light blocking slit 30. Thus, the maximum light intensity is detected in the detector 16.

In the present embodiment, the variable light blocking slit 30 is moved along the Z-axis (optical axis) using the light intensity characteristics depending on the defocus position as described above. Then, the calculation unit 17A finds the best focus position by searching the point in which the light intensity is maximized.

When it is not determined that the position of the variable light blocking slit 30 in the optical axis direction is the position in which the light intensity is maximized (NO in step S50), the exposure apparatus 1A repeats the procedures for searching the position in which the light intensity is maximized (Zs).

In other words, the exposure apparatus 1A repeats the procedure for measuring the light intensity of the EUV light 70 that has passed through the variable light blocking slit 30 by moving the variable light blocking slit 30 along the optical axis, and the procedure in which the calculation unit 17A determines whether the light intensity is maximum.

As a result, the calculation unit 17A searches the position in which the light intensity is maximized (Zs). When it is determined that the position of the variable light blocking slit 30 in the optical axis direction is the position in which the light intensity is maximized (Yes in step S50), the calculation unit 17A stores the position in which the light intensity is maximized as the best focus position.

After that, the calculation unit 17A finds a wafer defocus value (ΔZs) based on the difference between the position in which the light intensity is maximized (Zs: focus position) and the initial position of the variable light blocking slit 30 in the Z direction. Then, the calculation unit 17A finds a mask defocus (ΔZm) based on the wafer defocus value (ΔZs).

The calculation unit 17A further finds the distortion (Δd) of the reflective mask 20A based on the amount of misalignment of the spot position (ΔXs and ΔYs). The exposure apparatus 1A performs the procedures in steps S10 to S50 on each of the measurement marks 21A on the reflective mask 20A.

This finds the values of misalignment (ΔXsn, ΔYsn, and ΔZsn) (n is a natural number) at the spot position of each of the measurement marks 21A. Then, the calculation unit 17A finds the mask defocus distribution and the distortion distribution based on the ΔZsn and Δd (ΔXsn and ΔYsn) at each measured position (step S60).

Figure 5:
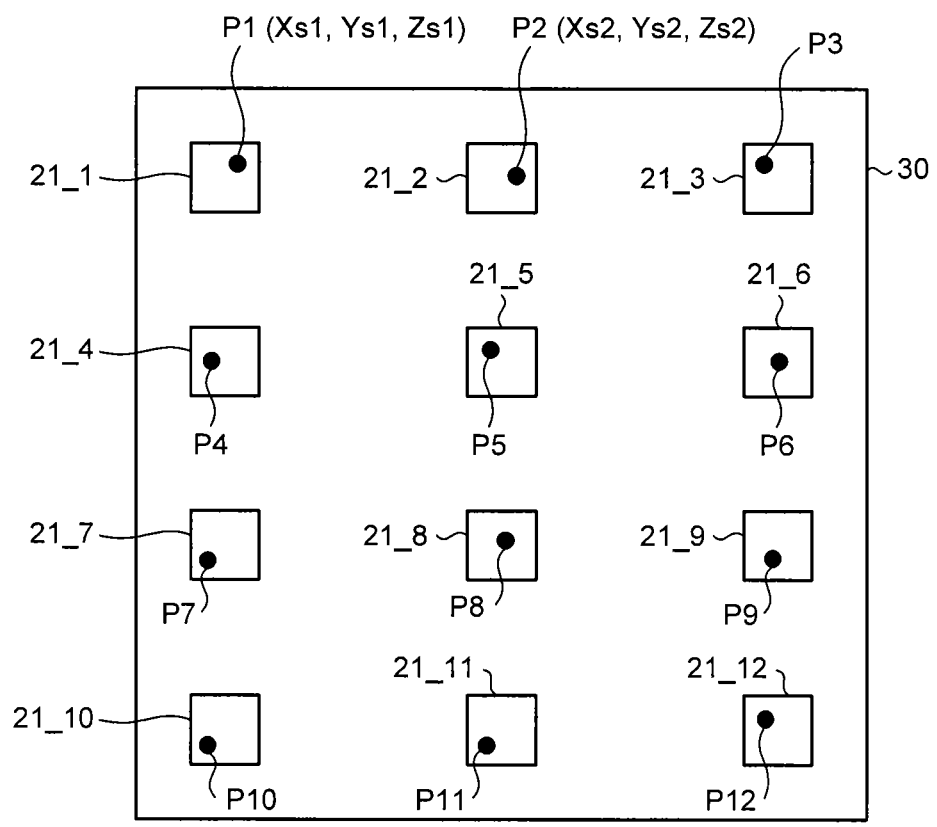
FIG. 5 is a diagram of an example of a mask defocus distribution and a distortion distribution.

FIG. 5 is a diagram of an example of the mask defocus distribution and the distortion distribution. FIG. 5 illustrates the spot position and focus position at each of the measurement marks 21A (measurement marks 21_1 to 21_12). The spot positions in the measurement marks 21_1 to 21_12 are denoted as spot positions P1 to P12 in FIG. 5.

The spot position P1 in the measurement mark 211 has the spot position (Xs1 and Ys1) and the focus position of Zs1. Thus, the spot position and focus position are denoted as P1 (Xs1, Ys1, and Zs1).

Further, the spot position P2 in the measurement mark 21_2 has the spot position (Xs2 and Ys2) and the focus position Zs2. Thus, the spot position and focus position are denoted as P2 (Xs2, Ys2, and Zs2).

Figure 6A:
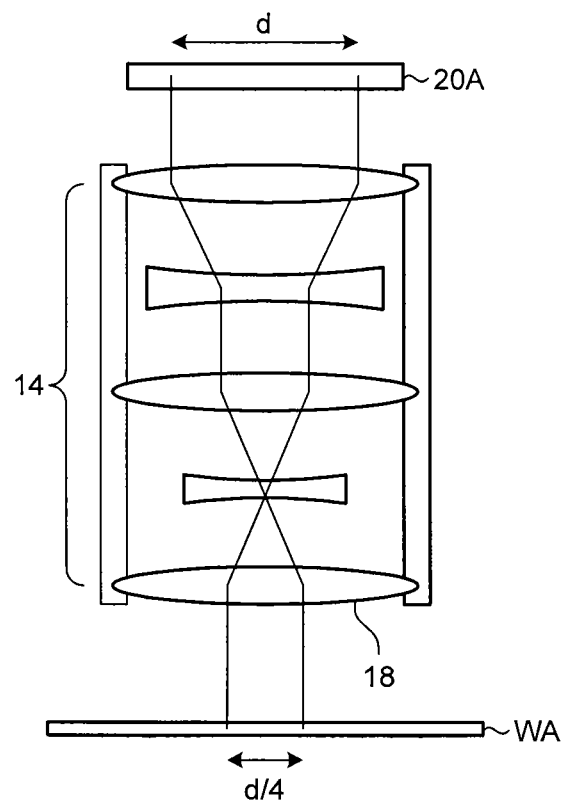
FIGS. 6A and 6B are diagrams for describing the relationship between an NA on the reflective mask side and an NA on the wafer side.
Figure 6B:
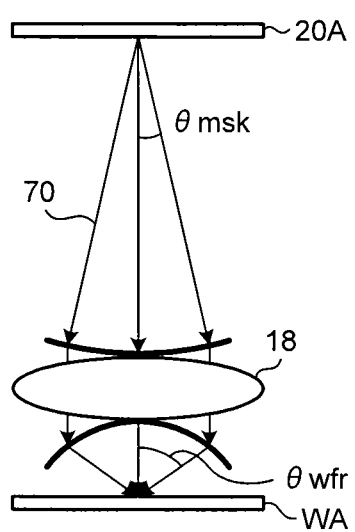

Hereinafter, a method for calculating the mask defocus will be described. FIGS. 6A and 6B are diagrams for describing the relationship between an NA on the reflective mask side and an NA on the wafer side.

FIG. 6A illustrates the relationship between the pattern dimensions of the reflective mask 20A, the projection optical system 14 including a projection lens 18, and the wafer WA. When the exposure apparatus 1A performs a quarter-scale projection, the pattern that has had a dimension d on the reflective mask 20A is transferred to the wafer WA in a dimension of d/4.

FIG. 6B schematically illustrates FIG. 6A. The projection lens 18 in the projection optical system 14 is irradiated, at a divergence angle of θmsk to the optical axis, with the EUV light 70 reflected on the reflective mask 20A. The wafer WA is irradiated, at a convergent angle of θwfr to the optical axis, with the EUV light 70 with which the projection lens 18 has been irradiated.

In that case, the magnification ratio Mag to the wafer WA is expressed by the following expression (1).

$$Mag = \frac{WNA}{MNA}\left(=\frac{\sin\theta_{wfr}}{\sin\theta_{msk}}\right) \quad (1)$$

The MNA in the expression (1) shows the Numerical Aperture (NA) on the reflective mask 20A side. The WNA shows the NA on the wafer WA side. When the exposure apparatus 1A performs a quarter-scale projection, the following expressions (2) and (3) are derived.

$$Mag = \frac{WNA}{MNA} = \frac{1}{4} \quad (2)$$

$$MNA = 4 \times WNA \quad (3)$$

It is known that ΔZs=Depth of Field (DOE) is expressed by the following expression (4) that is a Rayliegh's expression relating to DOF.

$$DOF = K1\frac{\lambda}{NA^2} \quad (4)$$

Replacing the NA on the wafer WA side with the NA on the reflective mask 20A side can find how much the defocus (ΔZs) on the wafer WA side affects the reflective mask 20A side. Thus, the DOF is expressed by the following expression (5) according to the expression (2) that is the NA relational expression and the expression (4) that is the Rayliegh's expression.

$$DOF = K1\frac{\lambda}{WNA^2} = K1\frac{\lambda}{\left(\frac{1}{4}\times MNA\right)^2} = 16\times K1\frac{\lambda}{MNA^2} \quad (5)$$

That the mask defocus (ΔZm) is 16 times larger than the wafer defocus (ΔZs) observed on the wafer WA is found by the expression (5). In other words, this is expressed by the following expression (6).

$$\Delta_{Zm} = 16 \cdot \Delta_{Zs} \quad (6)$$

As described above, it is found that the impact of the mask defocus generated on the reflective mask 20A is reduced to one sixteenth on the wafer WA.

Next, the calculation of the distortion will be described. The reflective mask 20A is irradiated with the EUV light 70 inclined 6° to the X direction. Thus, the misalignment on the wafer WA (ΔDXw and ΔDYw) can be expressed the following expressions (7) and (8) using the magnification ratio (Mag), the mask defocus (ΔZm) and the mask pattern misalignment (ΔDXm and ΔDYm).)

$$\Delta_{DXw} = Mag \cdot (\Delta_{Zm} \cdot \mathrm{Sin}(6°) + \Delta_{DXm}) \quad (7)$$

$$\Delta_{DYw} = Mag \cdot (\Delta_{DYm}) \quad (8)$$

In that case, the mask defocus (ΔZm) can be found from the expression (6) and the wafer defocus value (ΔZs). Further, the misalignment on the wafer WA (ΔDXw and ΔDYw) can be found from the spot position (ΔXs and ΔYs).

As described above, the mask defocus (ΔZm) and the amount of misalignment of the mask pattern (ΔDXm and ΔDYm) can separately be measured in the present embodiment. The calculation unit 17A of the exposure apparatus 1A calculates the mask defocus based on the wafer defocus and calculates the distortion based on the amount of misalignment of the mask pattern.

Figure 7:
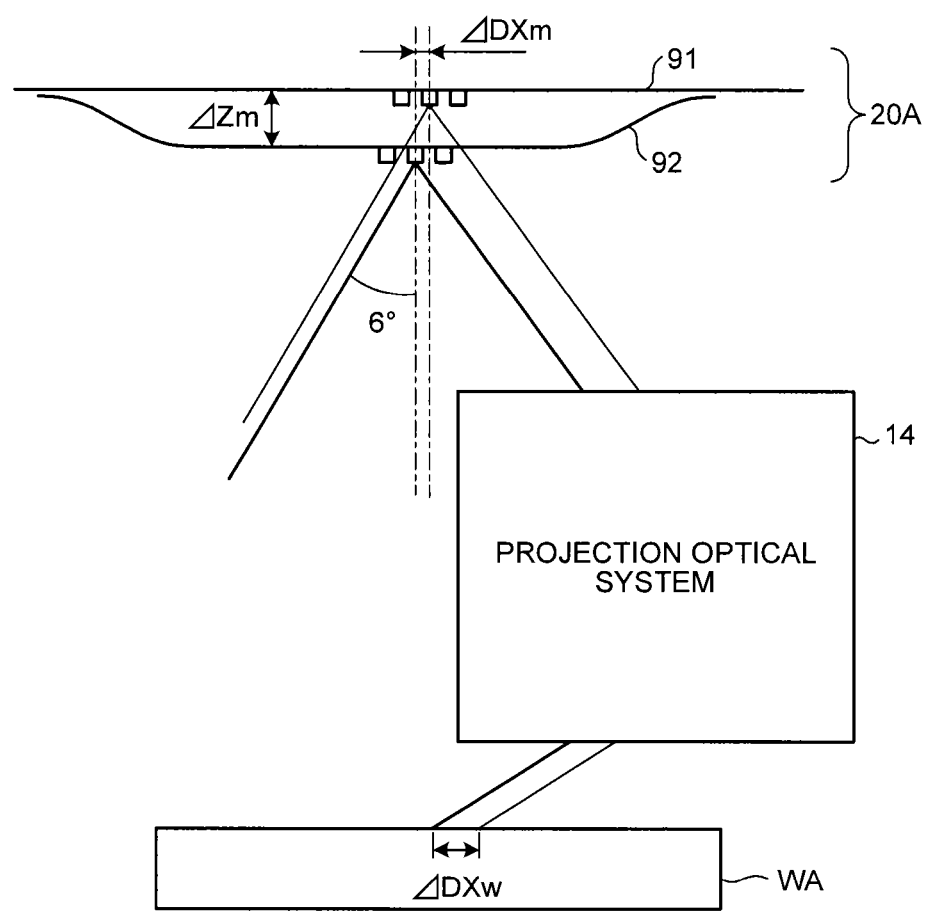
FIG. 7 is a diagram for describing the relationship between the amount of misalignment and the mask defocus on a mask pattern and the misalignment on a wafer pattern.

FIG. 7 is a diagram for describing the relationship between the misalignment and the mask defocus on a mask pattern and the misalignment on a wafer pattern. FIG. 7 is a cross-sectional view of the reflective mask 20A and the wafer WA.

When a particle or the like is not attached on the backside surface of the reflective mask 20A, the mask pattern on the reflective mask 20A is arranged on an ideal pattern surface 91. On the other hand, when a particle or the like is attached on the backside surface of the reflective mask 20A, the mask pattern on the reflective mask 20A is arranged on the ideal pattern surface 91. The particle or the like warps the reflective mask 20A. Thus, an actual pattern surface 92 warps toward the wafer WA side in comparison with the ideal pattern surface 91.

When the amount of misalignment of the mask pattern has the (ΔDXm and ΔDYm) and the mask defocus has the ΔZm on the actual pattern surface 92, the amount of misalignment on the wafer WA has the (ΔDXw and ΔDYw). The ΔDXw is expressed by the expression (7) because the actual pattern surface 92 is irradiated with the EUV light 70 inclined 6° to the X direction.

The exposure apparatus 1A corrects the mask defocus using a mask flection correction mechanism included in the mask stage 10. Specifically, the calculated mask defocus distribution is input as the parameter in the mask flection correction mechanism. Thus, the mask flection correction mechanism corrects the mask defocus based on the mask defocus distribution.

The exposure apparatus 1A further corrects the distortion distribution using a mask distortion correction mechanism included in the mask stage 10. Specifically, the calculated distortion distribution is input as the parameter in the mask distortion correction mechanism. Thus, the mask distortion correction mechanism corrects the mask pattern misalignment (distortion) based on the distortion distribution.

As described above, the exposure apparatus 1A can reduce a transfer pattern defocus and a transfer position misalignment by correcting the mask defocus and the distortion.

As described above, the exposure apparatus 1A can appropriately correct the image plane caused by the flection of the reflective mask 20A and the distortion caused by the misalignment of the reflective mask 20A using the mask defocus distribution and the distortion distribution.

Figure 8:
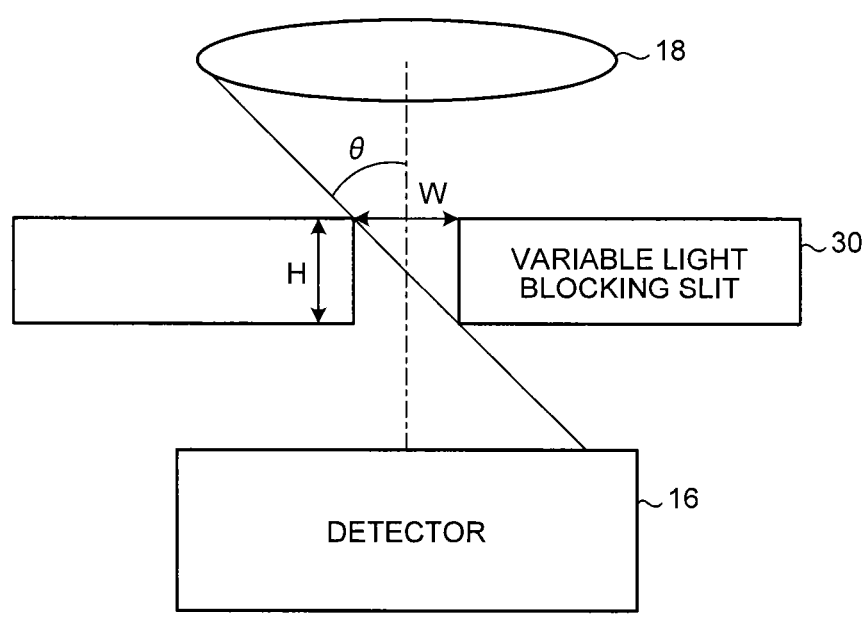
FIG. 8 is a diagram for describing a slit size of the variable light blocking slit.

Next, the slit size of the variable light blocking slit 30 will be described. FIG. 8 is a diagram for describing a slit size of the variable light blocking slit. The aperture area of the variable light blocking slit 30 has a width W and a thickness (Slit thickness) H. The EUV light 70 entering the variable light blocking slit 30 from the projection lens 18 has an incidence angle θ to the optical axis.

For example, when NA=0.4 and H=0.1 mm hold, $$W = H \times \tan(\sin(-1)NA)$$
$$= 0.1 \times 0.43$$
$$= 0.043 \text{ nm holds.}$$

In that case, the variable light blocking slit 30 can block even the zero order light or primary order light from the pattern at the resolution limit if the variable light blocking slit 30 has an aperture area having a width of 0.043 mm.

For example, when the pattern of 200 nm on the wafer WA (800 nm on the mask) is resolved, the resolution=(1/K1)×λ/NA and the NA=13.5/4/200=0.017 hold. Thus, when it is necessary to block only the zero order light and the primary order light in the EUV light 70, the width of the aperture can nearly be set at W=0.0017 mm.

Note that, although the variable light blocking slit 30 includes 12 aperture areas 33X in the present embodiment, the variable light blocking slit 30 can include 11 or less, or 13 or more aperture areas 33X. For example, when the variable light blocking slit 30 includes an aperture area 33X and measures the mask defocus at 12 places, the exposure apparatus 1A moves the aperture area 33X through the 12 places in sequence so as to measure the mask defocus or the like. Although the exposure apparatus 1A includes a detector 16 in the present embodiment, the exposure apparatus 1A can include a plurality of detectors 16.

As described above, the mask defocus and the distortion are measured after the aperture area of the variable light blocking slit 30 is narrowed at the spot position in the present embodiment. This can measure the mask defocus and the distortion with a high degree of accuracy in a simply configuration even in the exposure apparatus 1A using the EUV exposure technology.

Second Embodiment

Next, the second embodiment will be described with reference to FIGS. 9 to 12B. The mask defocus is measured using a measurement mark with unequal-pitched line and space patterns in the second embodiment.

Figure 9:
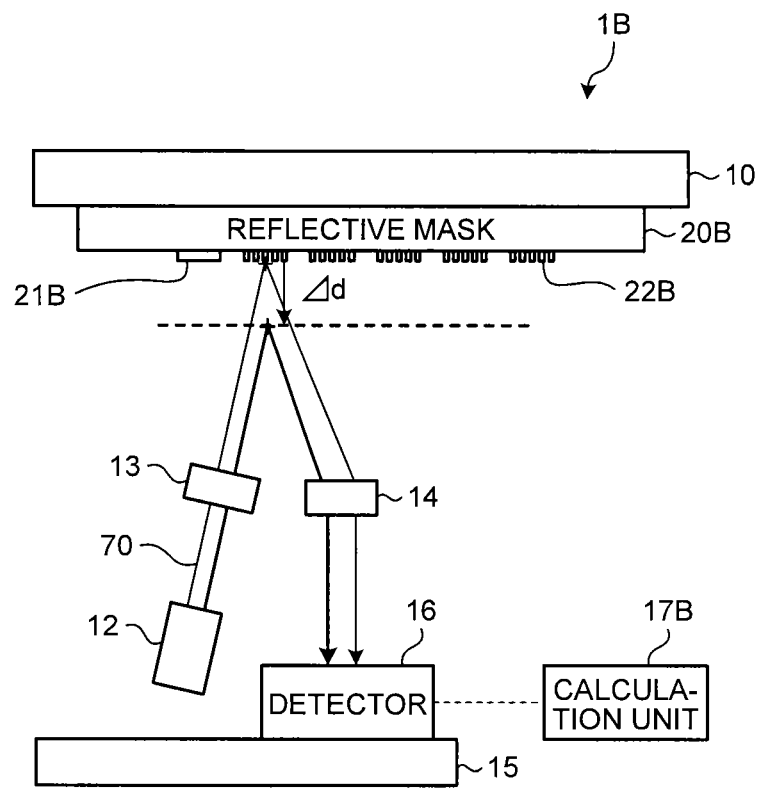
FIG. 9 is a diagram of a configuration of an exposure apparatus according to a second embodiment.

FIG. 9 is a diagram of a configuration of an exposure apparatus according to the second embodiment. FIG. 9 is a schematic side view of an exposure apparatus 1B. The components that implement the same functions as the exposure apparatus 1A in the first embodiment illustrated in FIG. 1 are denoted with the same reference signs in FIG. 9 and the overlapping descriptions will be omitted.

The exposure apparatus 1B includes a mask stage 10, a light source 12, an illumination optical system 13, a projection optical system 14, a wafer stage 15, a detector 16, and a calculation unit 17B. The exposure apparatus 1B in the present embodiment measures a mask defocus using a reflective mask 20B.

A circuit pattern 22B of the semiconductor apparatus and a measurement mark 21B are formed on the reflective mask 20B in the present embodiment. The measurement mark 21B is used for measuring the mask defocus of the reflective mask 20B. The measurement mark 21B is a light blocking pattern with unequal-pitched lines and spaces.

The detector 16 is positioned, for example, on the wafer stage 15. Note that the detector 16 can also be positioned at a side of the wafer stage 15. The detector 16 is a two-dimensional detector (aerial image detector) that measures the light intensity of the EUV light 70 reflected on the reflective mask 20B. The detector 16 measures the light intensity at each position of the wafer stage 15 in the optical axis direction (the detector 16). The calculation unit 17B obtains the position of the wafer stage having the maximum light intensity in the optical axis direction among the light intensities measured with the detector 16 from a drive unit (not illustrated in the drawings) that drives the wafer stage 15 so as to calculate the mask defocus of the reflective mask 20B based on the obtained position.

The illumination optical system 13 irradiates the reflective mask 20B on the mask stage 10 with the EUV light 70 from the light source 12. The EUV light 70 is reflected on the reflective mask 20B and is transmitted to the projection optical system 14.

When the mask defocus is measured, the measurement mark 21B is irradiated with the EUV light 70. The EUV light 70 is reflected on the measurement mark 21B. The illumination optical system 13 causes the EUV light 70 from the light source 12 to enter the reflective mask 20B at an angle of 6°.

The EUV light 70 reflected on the measurement mark 21B is transmitted to the projection optical system 14. The projection optical system 14 irradiates the detector 16 on the wafer stage 15 with the EUV light 70 reflected on the reflective mask 20B. Thus, the detector 16 measures the light intensity of the EUV light 70. The calculation unit 17B calculates the mask defocus of the reflective mask 20B based on the position having the maximum result (detection value of the light intensity) measured with the detector 16.

Figure 10:
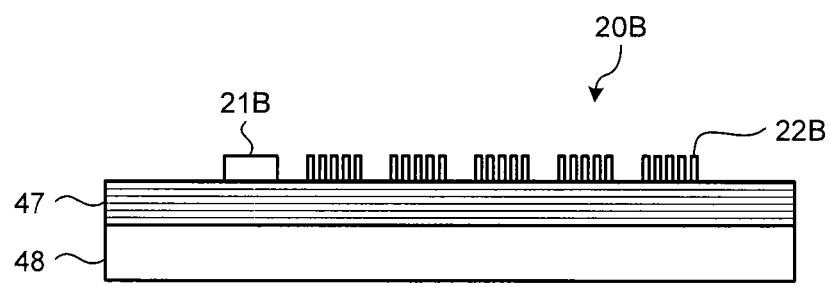
FIG. 10 is a diagram of a configuration of a reflective mask according to the second embodiment.

FIG. 10 is a diagram of a configuration of the reflective mask according to the second embodiment. FIG. 10 illustrates a cross-sectional configuration of the reflective mask 20B. The reflective mask 20B includes a glass substrate 48, a reflective multi-layer film 47, and a light blocking pattern (the measurement mark 21B and the circuit pattern 22B).

The reflective multi-layer film 47 is formed on the glass substrate 48. The light blocking pattern is formed on the reflective multi-layer film 47. The light blocking pattern includes a patterned buffer layer and an absorber layer.

The measurement marks 21B for measuring the mask defocus are positioned at a plurality of places on the patterned side of the reflective mask 20B. The measurement marks 21B are positioned, for example, on the patterned surface (in the shot) of the reflective mask 20B as forming a matrix. The measurement marks 21B are positioned, for example, at the same places as the measurement marks 21A on the reflective mask 20B. A mark with unequal-pitched line and space patterns is used as the measurement mark 21B.

Figure 11:
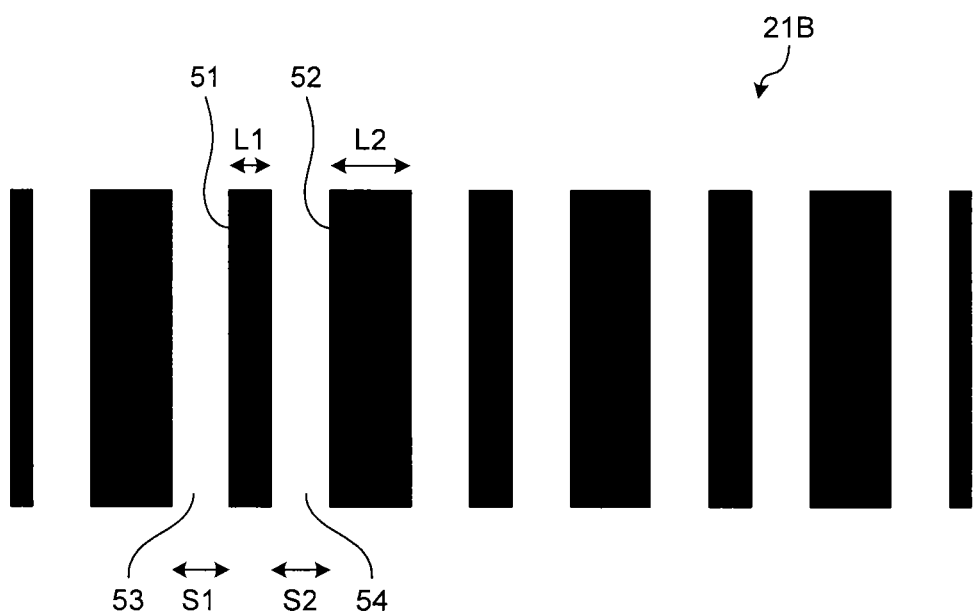
FIG. 11 is a diagram of a configuration of a measurement mark according to the second embodiment.

FIG. 11 is a diagram of a configuration of the measurement mark according to the second embodiment. FIG. 11 is a top view of the measurement mark 21B. The measurement mark 21B includes a plurality of line patterns. The line patterns in the measurement mark 21B, for example, have various widths and are positioned at regular intervals. In other words, the line patterns are arranged at various pitches in the measurement mark 21B.

A first line pattern 51 has a width L1 and a second line pattern 52 has a width L2 in the measurement mark 21B. A space pattern (first space pattern 53) adjoining to the first line pattern 51 has a width S1 and the other space pattern (second space pattern 54) adjoining to the first line pattern 51 has a width S2. In other words, a first pitch formed with the first space pattern 53 and the first line pattern 51 has (S1+L1) and a second pitch formed with the second space pattern 54 and the second line pattern 52 has (S2+L2).

For example, S1=S2 and L1<L2 hold in the measurement mark 21B. The pitch of the measurement mark 21B has been set according to the NA, σ, illumination shape, and the like of the light source 12 in the exposure apparatus 1B. Note that a plurality of types of measurement marks 21B can be positioned in a mark formation area. In that case, when the mask defocus is measured, the measurement mark 21B appropriate to the light source 12 in the exposure apparatus 1B is selected from among the various types of measurement marks 21B.

Next, a method for measuring the mask defocus will be described. When the reflective mask 20B is irradiated with the EUV light 70, the reflected and diffracted light from the measurement mark 21B is transmitted to the detector 16 positioned at the upper side of the wafer stage 15 through the projection optical system 14. The detector 16 detects the reflected and diffracted light from the measurement mark 21B as an aerial image.

Figure 12A:
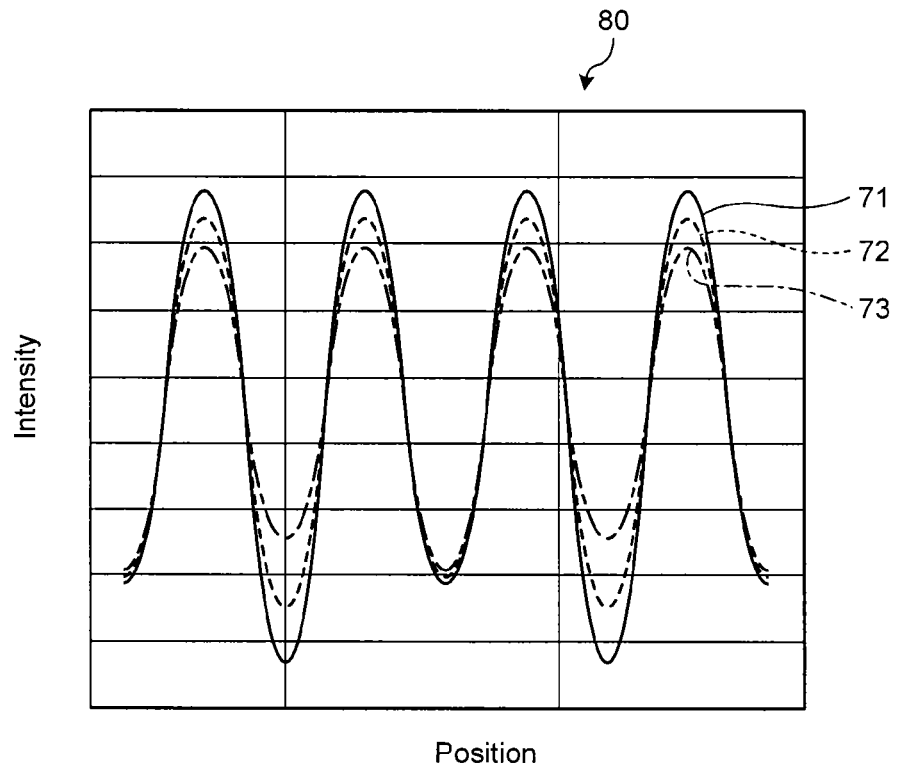
FIG. 12A is a diagram of a light intensity distribution obtained from the measurement mark according to the second embodiment.

FIG. 12A is a diagram of a light intensity distribution obtained from the measurement mark according to the second embodiment. FIG. 12A illustrates a light intensity distribution 80 of each focus value. The positions detected by the detector 16 (detected positions corresponding to the measurement marks 21B) (Position) are shown on the horizontal axis and the light intensities (Intensity) detected by the detector 16 are shown on the vertical axis in FIG. 12A.

When measuring the mask defocus, the exposure apparatus 1B causes the detector 16 to detect the light intensity while changing the position of the reflective mask 20B (the mask stage 10) in the Z direction (focus value). This obtains characteristics 71 to 73 illustrated in FIG. 12A.

The characteristic 71 is the light intensity characteristic when the detector 16 measures the light intensity at a first focus position. The characteristic 72 is the light intensity characteristic when the detector 16 measures the light intensity at a second focus position (plus defocus value). The characteristic 73 is the light intensity characteristic when the detector 16 measures the light intensity at a third focus position (minus defocus value). It is found in FIG. 12A that the characteristic 71 is a best focus because the waveform of the characteristic 71 widely varies.

The exposure apparatus 1B in the present embodiment uses the measurement mark 21B that is to have a large difference (contrast) between the maximum value and the minimum value of the light intensity characteristic at the best focus.

Figure 12B:
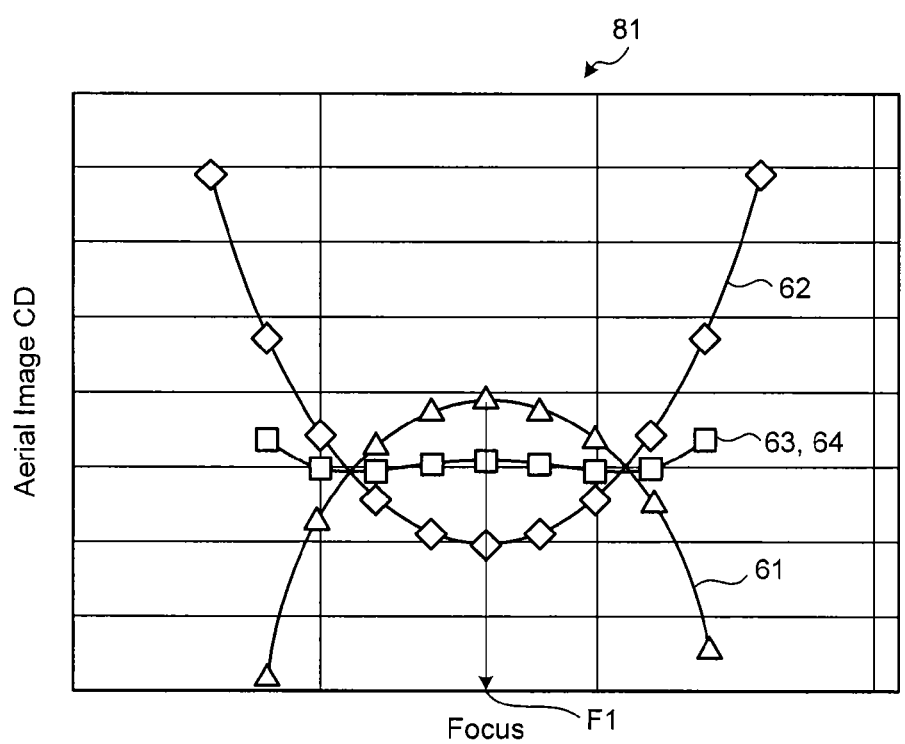
FIG. 12B is a diagram for describing the relationship between a focus value and a pattern dimension.

FIG. 12B is a diagram for describing the relationship between a focus value and a pattern dimension. Focus values are shown on the horizontal axis and the dimensions of the aerial images of the patterns transferred on the wafer WA (Aerial Image CD) (hereinafter, referred to as the aerial image dimension) are shown on the vertical axis in FIG. 12B. The dimension characteristics 81 correspond to the light intensity distribution and focus values illustrated in FIG. 12A.

The positions in which the characteristics 71 to 73 have light intensities larger than a predetermined threshold among the detected positions illustrated in FIG. 12A are the positions in which a pattern is formed on the wafer WA. Thus, setting a predetermined threshold on the characteristics 71 to 73 illustrated in FIG. 12A can obtain characteristics 61 to 64 illustrated in FIG. 12B.

The characteristic 61 shows how the aerial image dimension characteristic when the first line pattern 51 is transferred on the wafer WA is changed by the variation of the focus value. The characteristic 62 shows how the aerial image dimension characteristic when the second line pattern 52 is transferred on the wafer WA is changed by the variation of the focus value. The characteristics 63 and 64 show how the aerial image dimension characteristic when the first space pattern 53 and the second space pattern 54 are transferred on the wafer WA is changed by the variation of the focus value.

In comparison of the light intensity distributions of the aerial images in the best focus of the reflective mask 20B and in a defocus of the reflective mask 20B, the contrast decreases in the defocus. In other words, the waveform in the defocus as the characteristics 72 or 73 is narrower than the characteristic 71 in the best focus. In other words, the dimensional difference between the aerial image dimension of the first line pattern 51 and the aerial image dimension of the second line pattern 52 decreases in a defocus. On the other hand, the dimensional difference between the aerial image dimension of the first line pattern 51 (the aerial image dimension at the focus value F1 of the characteristic 61) and the aerial image dimension of the second line pattern 52 (the aerial image dimension at the focus value F1 of the characteristic 62) increases in the best focus (focus value F1 of the characteristic 71).

When the measurement mark 21B is formed with equal-pitched patterns, the dimensional difference between the aerial image dimension of the first line pattern 51 and the aerial image dimension of the second line pattern 52 decreases at any focus value.

Thus, when the focus value varies from the best focus to a defocus, the aerial image dimension varies from the aerial image dimension when the measurement mark 21B is formed with unequal-pitched patterns to the aerial image dimension when the measurement mark 21B is formed with equal-pitched patterns.

Thus, the calculation unit 17B adjusts the position of the reflective mask 20B (the mask stage 10) in the Z direction such that the light intensity distribution has the maximum contrast (difference between the aerial image dimensions) or such that the dimensional difference between the aerial image dimensions (the pitch inequality) is maximized. The adjustment result is the best focus for the reflective mask 20B. The amount of adjustment from the initial position of the reflective mask 20B to the best focus in the Z direction is the amount of the mask focus correction.

The best focus position is measured as described above at each of the measurement marks 21B positioned on the mask surface (in the shot) of the reflective mask 20B. The calculation unit 17B approximates the relationship between the position of each measurement mark 21B and the focus value at the position with a first or higher-order polynomial. As a result, the calculation unit 17B calculates the approximation such that the mask defocus is minimized. Specifically, the calculation unit 17B calculates the distribution of the defocus values (amount of the mask focus correction) in the shot (mask defocus distribution) using the mask focus value at each measurement mark 21B. As a result, the exposure apparatus 1B adjusts the position of the reflective mask 20B in the Z direction such that the focus value is the best focus.

The mask defocus and the distortion are performed, for example, at every layer in the wafer processing (every time when the reflective mask 20A or 20B is used). Then, a semiconductor apparatus (semiconductor integrated circuit) is produced after the mask defocus distribution and the distortion distribution are corrected as necessary. Specifically, the wafer WA on which a resist has been applied is exposed using the reflective mask 20A or the reflective mask 20B. After that, the wafer WA is developed such that a resist pattern is formed on the wafer WA. The layer of the wafer WA lower than the resist is etched using the resist pattern as a mask. This forms an actual pattern corresponding to the resist pattern on the wafer WA. To produce a semiconductor apparatus, the process for measuring the mask defocus and the distortion, the process for correcting the mask defocus and the distortion, the exposure process, the development process, the etching process, and the like are repeated per layer.

According to the second embodiment as described above, measuring the mask defocus using the measurement mark 21B with unequal-pitched line and space patterns can measure the mask defocus distribution as the mask flection with a high degree of accuracy in a simple configuration even in the exposure apparatus 1B using the EUV exposure technology.

According to the first and second embodiments as described above, the mask flection can easily be measured with a high degree of accuracy even in an EUV exposure apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
    a light blocking unit that passes an exposure light reflected on a reflective mask through an aperture and blocks the exposure light at a part other than the aperture;
    a detection unit that measures a light intensity of the exposure light passed through the light blocking unit; and
    a calculation unit that calculates, based on the light intensity, a transfer characteristic when a pattern on the reflective mask is transferred to a substrate,
    wherein, in the light blocking unit, an in-plane position that is a position of the aperture on an aperture plane is adjusted with respect to the detection unit and a position in an axial direction that is a position in an optical axis direction of the exposure light is adjusted with respect to the detection unit, and
    the calculation unit calculates, based on the position in the axial direction in which the light intensity is maximized after the in-plane position is adjusted, the transfer characteristic.

2. The exposure apparatus according to claim 1,
    wherein the calculation unit calculates a best focus and a distortion for the reflective mask as the transfer characteristic.

3. The exposure apparatus according to claim 2,
    wherein the calculation unit calculates a distribution of the best focus and a distribution of the distortion on a mask surface of the reflective mask as the transfer characteristic.

4. The exposure apparatus according to claim 1,
wherein the detection unit measures the light intensity of the exposure light without blocking the exposure light using the light blocking unit,
the calculation unit creates a light intensity map of the exposure light reflected on the reflective mask so as to calculate a spot position that is a center of the light intensity map,
the light blocking unit is adjusted such that the in-plane position is a predetermined aperture area centering the spot position,
the position of the light blocking unit is adjusted in the axial direction,
the detection unit detects the light intensity at each of the positions in the axial direction, and
the calculation unit calculates the transfer characteristic based on the light intensity at each of the positions in the axial direction.

5. The exposure apparatus according to claim 4,
wherein the light blocking unit is adjusted such that the in-plane position is a predetermined aperture area centering the spot position by an adjustment of an aperture dimension of the aperture, or such that the in-plane position is a predetermined aperture area centering the spot position by a motion of the aperture having a predetermined area to the spot position.

6. A transfer characteristics measuring method comprising:
passing, using a light blocking unit positioned on a light path between a reflective mask and a wafer stage, an exposure light reflected on the reflective mask through an aperture and blocking the exposure light at a part other than the aperture;
measuring, using a detection unit, a light intensity of the exposure light passed through the light blocking unit; and
calculating, using a calculation unit and based on the light intensity, a transfer characteristic when a pattern on the reflective mask is transferred to a substrate,
wherein, in the light blocking unit, an in-plane position that is a position of the aperture on an aperture plane is adjusted with respect to the detection unit and a position in an axial direction that is a position in an optical axis direction of the exposure light is adjusted with respect to the detection unit, and
the calculation unit calculates, based on the position in the axial direction in which the light intensity is maximized after the in-plane position is adjusted, the transfer characteristic.

7. The transfer characteristics measuring method according to claim 6,
wherein the calculation unit calculates a best focus and a distortion for the reflective mask as the transfer characteristic.

8. The transfer characteristics measuring method according to claim 7,
wherein the calculation unit calculates a distribution of the best focus and a distribution of the distortion on a mask surface of the reflective mask as the transfer characteristic.

9. The transfer characteristics measuring method according to claim 6,
wherein the detection unit measures the light intensity of the exposure light without blocking the exposure light using the light blocking unit,
the calculation unit creates a light intensity map of the exposure light reflected on the reflective mask so as to calculate a spot position that is a center of the light intensity map,
the light blocking unit is adjusted such that the in-plane position is a predetermined aperture area centering the spot position,
the position of the light blocking unit is adjusted in the axial direction,
the detection unit detects the light intensity at each of the positions in the axial direction, and
the calculation unit calculates the transfer characteristic based on the light intensity at each of the positions in the axial direction.

10. The transfer characteristics measuring method according to claim 9,
wherein the light blocking unit is adjusted such that the in-plane position is a predetermined aperture area centering the spot position by an adjustment of an aperture dimension of the aperture, or such that the in-plane position is a predetermined aperture area centering the spot position by a motion of the aperture having a predetermined area to the spot position.

\* \* \* \* \*